United States Patent [19]

Parks

[11] Patent Number: 5,369,605
[45] Date of Patent: Nov. 29, 1994

[54] INCREMENTAL SEARCH CONTENT ADDRESSABLE MEMORY FOR INCREASED DATA COMPRESSION EFFICIENCY

[75] Inventor: Terry J. Parks, Round Rock, Tex.

[73] Assignee: Dell USA, L.P., Austin, Tex.

[21] Appl. No.: 88,966

[22] Filed: Jul. 7, 1993

[51] Int. Cl.$^5$ ............................. G06F 7/00; G06F 7/02
[52] U.S. Cl. .............................. 364/715.09; 340/146.2
[58] Field of Search ...................... 364/715.09, 715.11; 340/146.2

[56] References Cited

U.S. PATENT DOCUMENTS

| | | | |
|---|---|---|---|
| 5,122,979 | 6/1992 | Culverhouse | 340/146.2 |
| 5,166,660 | 11/1992 | Peterson et al. | 340/146.2 |
| 5,212,697 | 5/1993 | Morita | 364/715.11 X |
| 5,274,835 | 12/1993 | Wakatani | 340/146.2 |

*Primary Examiner*—Tan V. Mai
*Attorney, Agent, or Firm*—James Huffman; Jeff Hood; B. Noel Kivlin

[57] ABSTRACT

A content addressable memory (CAM) which is capable of performing string search functions in hardware. The implementation of string search in hardware eliminates the requirement of software to perform this function and thus significantly increases data compression performance. Each byte or memory storage unit of the CAM includes a comparator and a single bit flip-flop. The comparator asserts a match signal to the flip-flop if the contents of a memory storage unit match external data and a prior memory storage unit match signal is asserted. Two types of comparison operations are provided by each memory storage unit. The first ignores the contents of a previous flip-flop, and this comparison operation is used for the first character of a string search. The second type of comparison operation takes into account the value latched in the preceding byte of the CAM. For example, the comparison for byte N only matches if the previous comparison for byte N-1 matched. Thus long sequences of bytes can be searched for with a byte wide CAM. Therefore, string searches can be performed in hardware, thus increasing data compression performance.

27 Claims, 3 Drawing Sheets

INCREMENTAL SEARCH CONTENT ADDRESSABLE MEMORY FOR INCREASED DATA COMPRESSION EFFICIENCY

FIELD OF THE INVENTION

The present invention relates to data compression in digital systems, and more specifically to an improved content addressable memory system which can perform string searches in hardware, thus increasing data compression performance.

DESCRIPTION OF THE RELATED ART

Computer systems are being called upon to store increasingly larger amounts of data. Despite continuing improvements in storage and transmission technology, the increasing amount of text and data stored in and transmitted between computers has increased the need for more efficient data storage and manipulation methods. In order to more efficiently store and transmit data, various types of data compression methods have been developed and refined.

Data compression essentially involves methods for representing text or data using as few bits of data as possible. Data compression methods can be divided into two classes referred to as statistical compression and dictionary compression. In statistical compression, a probability distribution or model is generated or estimated for each of the characters and/or character strings comprising the document to be compressed, and a coding scheme is chosen for the document based on this probability distribution. The more the probability distribution model resembles the source of the text, the better the document can be compressed. Dictionary coding, on the other hand, achieves compression by replacing groups of consecutive characters, i.e. phrases or character strings, with indexes into a dictionary. The dictionary comprises a list of phrases that are expected to occur frequently or have occurred frequently in the document. The indexes are chosen so that, on average, they take less space than the phrase they encode, thereby achieving compression.

Statistical compression schemes using high order context models can generally outperform corresponding dictionary compression schemes. However, dictionary compression schemes are often used because they require less computer time and computer memory than corresponding statistical schemes.

Compression schemes may be classified as either static, semi-adaptive, or adaptive. In a statistical compression scheme using static modeling, a fixed probability distribution model is used regardless of the text to be encoded. Similarly, static dictionary encoders use a fixed dictionary of commonly used words and phrases wherein the dictionary does not change regardless of the content of the document or message being compressed. One problem with static compression methods is that the choice of the probability model or dictionary is critical. For example, the choice of a probability distribution model or dictionary may be suitable for one message being transmitted but may be entirely unsuitable or ill-adapted for another message.

A different approach that is commonly used is referred to as semi-adaptive coding or modeling. In a statistical compression scheme, semi-adaptive modeling requires the encoder to create a "codebook" of the most frequently used codes that is specific to the message being sent. The codebook is then transmitted with the coded message. Similarly, a semi-adaptive dictionary encoder method requires the generation of a dictionary specific to the particular text being encoded. In this manner, the dictionary accumulates idiosyncratic phrases that occur frequently in the text, such as technical terms that would not be found in other texts. For example, if a biology textbook were being compressed, the phrase "b-i-o-l-o-g" would be useful in the dictionary, yet this phrase would not be much help in compressing the works of Shakespeare. One drawback to semi-adaptive compression schemes is that a new codebook or dictionary must be stored or transmitted with the compressed form of each new document. In some instances, transmission of the codebook or dictionary and the compressed document requires more bytes of data than transmission of the original, uncompressed document. Also, two passes through the document are required for encoding, one for creating the codebook or dictionary, and the other for transmitting the coded message.

A better approach to compression is referred to as adaptive compression. In an adaptive statistical compression scheme, words or character strings are added to the codebook "on the fly" as the message is being encoded. Similarly, adaptive dictionary compression operates by replacing repeated character strings in the document being compressed with a reference to an earlier occurrence of the string. In general, a compression scheme is said to use adaptive coding if the code or dictionary used for a particular character or character string is based on the text already transmitted.

High performance compression engines many times use content addressable memories (CAMs) for string search to find repeated strings in the document being compressed. Content addressable memory is memory that is addressed not by a memory address but by the memory's contents, i.e. the data stored in memory. This allows for extremely fast data comparisons. However, since there is generally no implied alignment or size of the string being searched in most compression methods, the CAM must be organized as an 8-bit wide byte. This limits the CAM to performing a character search, and software is required to implement a string search on top of the character search implemented in hardware. One problem with this type of implementation is that the software required to perform string searches considerably slows down the compression process. Therefore, an improved compression implementation is desired which does not require software for string searches and thus increases compression speed and efficiency.

Background on Ziv-Lempel compression is deemed appropriate. Virtually all practical adaptive dictionary encoders emanate from a family of algorithms developed by Ziv and Lempel and are referred to as Ziv-Lempel (LZ) coding. Ziv-Lempel compression operates by finding strings and substrings which are repeated in the document. The essence of LZ algorithms is that repeated phrases in the document being compressed are replaced with a pointer to where they have occurred earlier in the text. Decoding a text that has been compressed in this manner simply requires replacement of the pointers by the already decoded text to which it points.

There are two primary design considerations involved in choosing a particular Ziv-Lempel compression scheme. One consideration involves whether there should be a limit to how far back a pointer can reach and, if so, what that limit should be. A second design consideration involves which substrings within this limit may be the target of a pointer. The reach of a pointer into earlier text may be unrestricted, referred to as growing window, or it may be restricted to a fixed size window of the previous N characters, where N is typically several thousand. The choice of sub-strings which may be the target of a pointer can either be unrestricted or limited to a set of phrases chosen according to some heuristic. Each combination of these choices represents a compromise between speed, memory requirements and compression.

One popular Ziv-Lempel compression scheme operates by finding strings and sub-strings which are repeated in a finite window of a data stream. In this scheme, pointers denote phrases or strings in a fixed size window, N, that precedes the coding position. The compression scheme uses a sliding window of N characters which are stored in a buffer commonly referred to as a history buffer. To encode the next string of characters, the characters stored in the history buffer are searched to find the longest string that matches the string being encoded.

SUMMARY OF THE INVENTION

The present invention comprises a content addressable memory (CAM) system which is capable of performing string search functions in hardware. The implementation of string search in hardware eliminates the requirement of software to perform this function, and this significantly increases data compression performance.

In a preferred embodiment, a Ziv-Lempel compression scheme is used, and an 8 bit wide by 2048 deep CAM is provided as a history buffer. Each memory storage unit or byte of the CAM includes a comparator and a single bit flip-flop according to the present invention which holds the results of a comparison. Each memory storage unit compares its contents with a character being searched. This result is provided to the subsequent byte in the CAM, and so on, to enable the CAM to perform string searches in hardware. In the preferred embodiment, two types of comparison operations are provided. The first type ignores the comparison result in the previous byte of CAM, and this comparison operation is used for the first byte or character of a string search. The second type of comparison operation takes into account the value latched in the preceding byte of the CAM. For example, the comparison for byte X only matches if the previous comparison for byte X-1 matched. Thus long sequences of bytes can be searched for with a byte wide CAM. Performing the string search in hardware obviates the necessity of software for this purpose and thus increases data compression performance.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
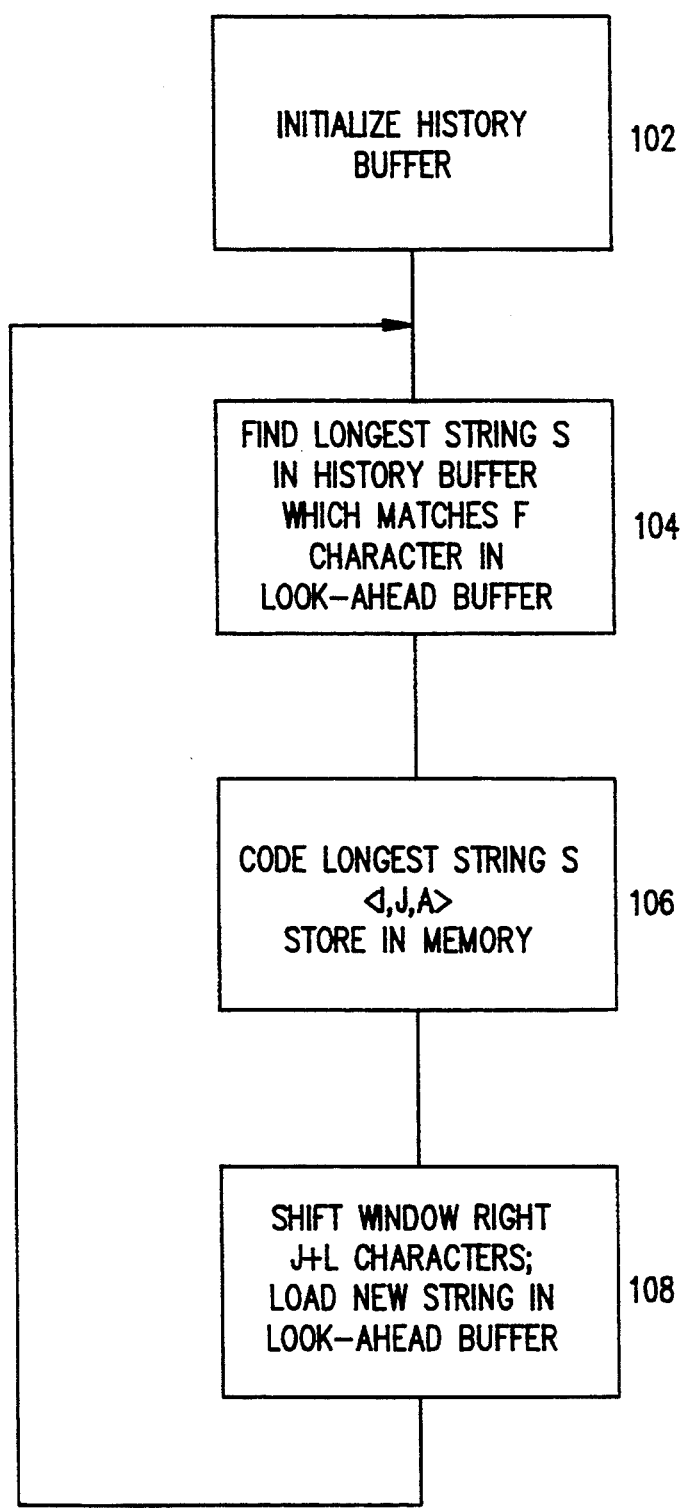
FIG. 1 is a flowchart diagram illustrating operation of a Ziv-Lempel compression scheme used in one embodiment of the invention.

Referring now to FIG. 1, a flowchart diagram illustrating operation of a Ziv-Lempel adaptive dictionary encoding scheme using the content addressable memory (CAM) 200 (FIG. 2) of the present invention is shown. In the preferred embodiment, a scheme similar to the Ziv-Lempel encoding scheme LZ77 is preferably used. However, it is noted that any of the various types of compression schemes, including either statistical or dictionary compression schemes, may be used. The present invention may also be used with either adaptive, semi-adaptive or static encoding schemes. It is further noted that the content addressable memory 200 of the present invention can be used in other applications where a string search is desired.

Figure 2:
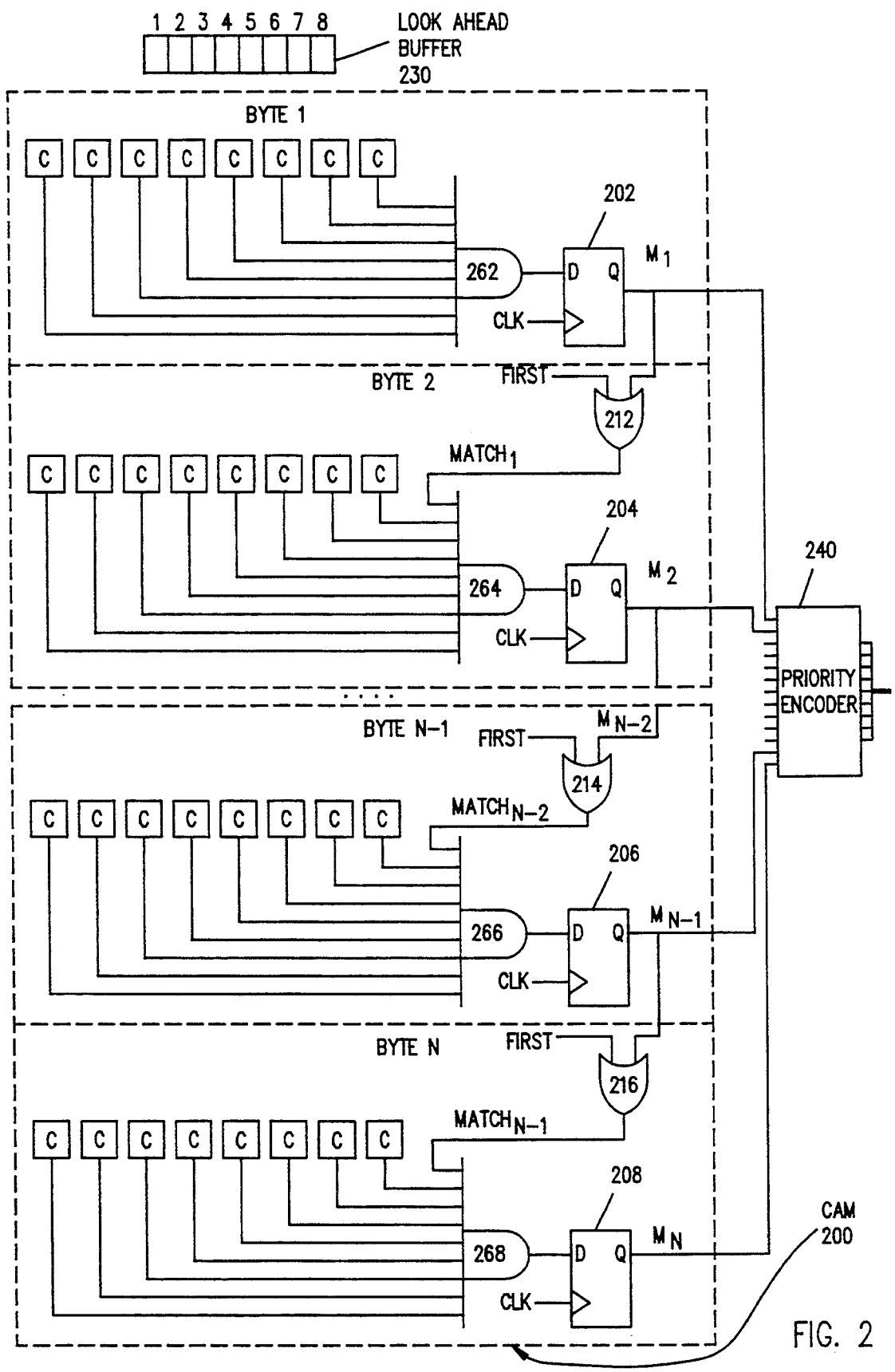
FIG. 2 illustrates a content addressable memory according to the preferred embodiment of the invention used to perform stringy arches in the compression scheme of FIG. 1.

In the encoding scheme of the preferred embodiment, pointers denote phrases in a fixed size window N that precedes the coding position. This window of N characters is stored in the CAM 200 illustrated in FIG. 2, which is referred to as the history buffer. Also, in the preferred embodiment there is a maximum length F for sub-strings that may be replaced by a pointer. These restrictions allow the encoding scheme to be implemented using a "sliding window" of N characters which have already been encoded. The F characters comprising the string to be encoded are stored in a buffer referred to as the look-ahead buffer 230 (FIG. 2). To encode the next string of F characters in the document, bytes 1 through N in the history buffer 200 are searched to find the string S which has the longest match with the string of F characters in the look-ahead buffer 230. For more information on the LZ77 compression scheme of the preferred embodiment, please see Bell, Cleary, and Witter, *Text Compression*, Copyright 1990, and published by Prentice-Hall, Inc., which is hereby incorporated by reference.

Referring now to FIG. 1, the dictionary compression scheme of the preferred embodiment is shown. In step 102 the history buffer 200 (FIG. 2) and the various variables required to implement the scheme are initialized as needed. In step 104 the compression method finds the longest string S in the history buffer 200 which matches the F characters in the look-ahead buffer 230 which are to be encoded. This step is performed by the content addressable memory (CAM) 200 illustrated in FIG. 2 according to the present invention, as discussed below. In step 106 the longest match or string, referred to as S, is coded, preferably using three values [i,j,a]. In the preferred embodiment, i is the offset of the longest match from byte 1 in the history buffer, j is the length of the match, and a is the first character that did not match the substring in the window. In step 108 the window is shifted right j+1 characters, or, in other words, the contents of the history buffer 200 are shifted left j+1 characters. A new string is also loaded in the look-ahead buffer 230. The coding steps 104–108 are then repeated. It is noted that including the first character that did not match the substring in each pointer ensures that coding can proceed even if no match is found for the first character in the look-ahead buffer 230.

Referring now to FIG. 2, the content addressable memory (CAM) 200 which performs string searches according to the present invention is shown. In the preferred embodiment, the CAM 200 is 8 bits wide by 2048 deep. However, it is noted that various sizes may be used. FIG. 2 illustrates bytes 1 and 2 as well as bytes 2047 and 2048, represented by N-1 and N, respectively. The remaining bytes of the CAM 200 and their associated logic are not illustrated in FIG. 2.

Each byte of the CAM 200 comprises eight CAM cells which are designated by the letter C, as shown, and each cell C stores a bit of data. The CAM cells C also include word lines and bit lines (not shown) which are used to input data into the CAM cells C as well as compare their contents with external data, respectively, as is well known in the art. Each byte of the CAM 200 is independently and in parallel capable of comparing its contents to a provided byte of data. Each byte of the CAM 200 further includes associated logic which enables the CAM 200 to perform string searches in hardware according to the present invention. Each unit of eight CAM cells C and associated logic are collectively referred to as a memory storage unit or byte of the CAM 200 for convenience.

The individual cells C for a respective memory storage unit or byte compare their contents with the eight bits representing the respective character being searched and provide their outputs to corresponding AND gates. For example, as shown in FIG. 2, bytes 1, 2, N-1, and N each include eight CAM cells C which provide their outputs to respective AND gates 262, 264, 266, and 268. The AND gate 262 in byte 1 of the CAM 200 is preferably an eight input AND gate as shown. Bytes 2-N or 2 through 2048 each include nine input AND gates. This is shown in FIG. 2 by the AND gates 264, 266 and 268 for bytes 2, N-1 and N. An extra input is required for these AND gates because these gates also receive a MATCH signal from the previous byte of the CAM 200 indicating whether a match occurred in the comparison performed by the previous byte. The received MATCH signal indicates the results of a previous comparison and is used to enable the CAM 200 of the present invention to search for long sequences of characters, i.e. character strings, with only a byte wide CAM.

As shown in FIG. 2, each of the CAM cells C in byte 1 of the CAM provides a comparison signal to the eight input AND gate 262. The AND gate 262 provides its output to the D input of a D type flip-flop 202 which generates an output signal referred to as $M_1$. The $M_1$ signal is provided to the input of a two input OR gate 212 in byte 2 of the CAM 200. The other input of the OR gate 212 receives a signal referred to as FIRST. The FIRST signal is asserted when the first character of a string being encoded in the look-ahead buffer 230 is compared with the data in a respective byte of the CAM 200. The output of the OR gate 212 is a signal referred as $MATCH_1$. The $MATCH_1$ signal is provided to an input of the nine input AND gate 264. The eight CAM cells C comprising byte 2 of the CAM 200 each generate compare signals that are provided to the other eight inputs of the AND gate 264. Therefore, if a match occurred in byte 1 of the CAM 200, the $MATCH_1$ signal is asserted, and the AND gate 264 in byte 2 of the CAM 200 will provide a positive output for the next character comparison depending on the comparison which occurs in the CAM cells C of byte 2. The output of the AND gate 264 is provided to the D input of a D type flip-flop 204 whose output is a signal referred to as $M_2$. The $M_2$ signal is then provided to an input of a two input OR gate (not shown) in byte 3 (also not shown) of the CAM 200. Bytes 3 through N-2 of the CAM 200, although not shown in FIG. 2, operate exactly as shown with regard to byte 2 of the CAM 200.

Byte N-2 (not shown) of the CAM generates a signal referred to as $M_{N-2}$ which is provided to an input of a two input OR gate 214. The FIRST signal is connected to the other input of the OR gate 214. The OR gate 214 generates a signal referred to as $MATCH_{N-2}$ which is provided to an input of the nine input AND gate 266. The eight CAM cells C comprising byte N-1 of the CAM 200 each generate compare signals that are provided to the other eight inputs of the AND gate 266. The output of the AND gate 266 is connected to the D input of a D type flip-flop 206. The Q output of the flip-flop 206 is a signal referred to as $M_{N-1}$. The $M_{N-1}$ signal is provided to an input of a two input OR gate 216 which is comprised in byte N of the CAM 200. The FIRST signal is provided to the other input of the OR gate 216. The output of the OR gate 216 is a signal referred to as $MATCH_{N-1}$ which is provided to an input of a nine input AND gate 268. The eight CAM cells C comprising byte N of the CAM 200 provide respective compare signals to the other eight inputs of the AND gate 268. The output of the AND gate 268 is provided to the D input of a D type flip-flop 208 whose Q output is a signal referred to as $M_N$. Each of the D type flip-flops 202, 204, 206 and 208 include clock inputs which receive a clocking signal referred to as CLK.

Two types of comparison operations are provided in the CAM 200 according to the preferred embodiment of the invention. One type of comparison operation is used for the first byte or character of the string search, and this comparison operation ignores the contents of the flip-flop in the previous byte of the CAM 200. For example, when a string search is performed in step 104, each byte of the history buffer 200 compares its contents with the first character of the string that is to be encoded in parallel. In these instances, the FIRST signal is asserted to each of the OR gates to ensure that the contents of the flip-flop in the previous byte of the CAM 200 is ignored. This guarantees that the respective match signal, referred to generically as $M_X$, output from each respective byte of the CAM 200 will be asserted or negated depending only on whether the first character in the string being encoded matches the character in the respective byte of the CAM 200 and not on any prior comparisons.

The second type of comparison operation takes into account the value previously latched into the flip-flop of the preceding byte. For example, the comparison for byte N only matches if the previous comparison for byte N-1 and stored in the byte N-1 latch 206 matched. This enables long sequences of bytes to be searched with a byte wide CAM 200 and thus does not require the use of software to perform this function.

Each byte of the CAM 200, bytes 1-N, also provides its respective matching signals $M_1$-$M_N$ to a priority encoder 240. The priority encoder 240 includes 2048 inputs and encodes these inputs into an 11 bit output. The priority encoder receives each of the matching signals $M_1$-$M_N$ and encodes a value representing the asserted $M_X$ signal that is spatially nearest to the string being encoded. In other words, the priority encoder 240 encodes the asserted $M_X$ signal whereby X is the lowest value of the $M_1$-$M_N$ signals that are asserted. A software method preferably controls the comparisons performed in the CAM 200 and determines the longest string S which matches the F characters in the look-ahead buffer 230, as described below.

Figure 3:
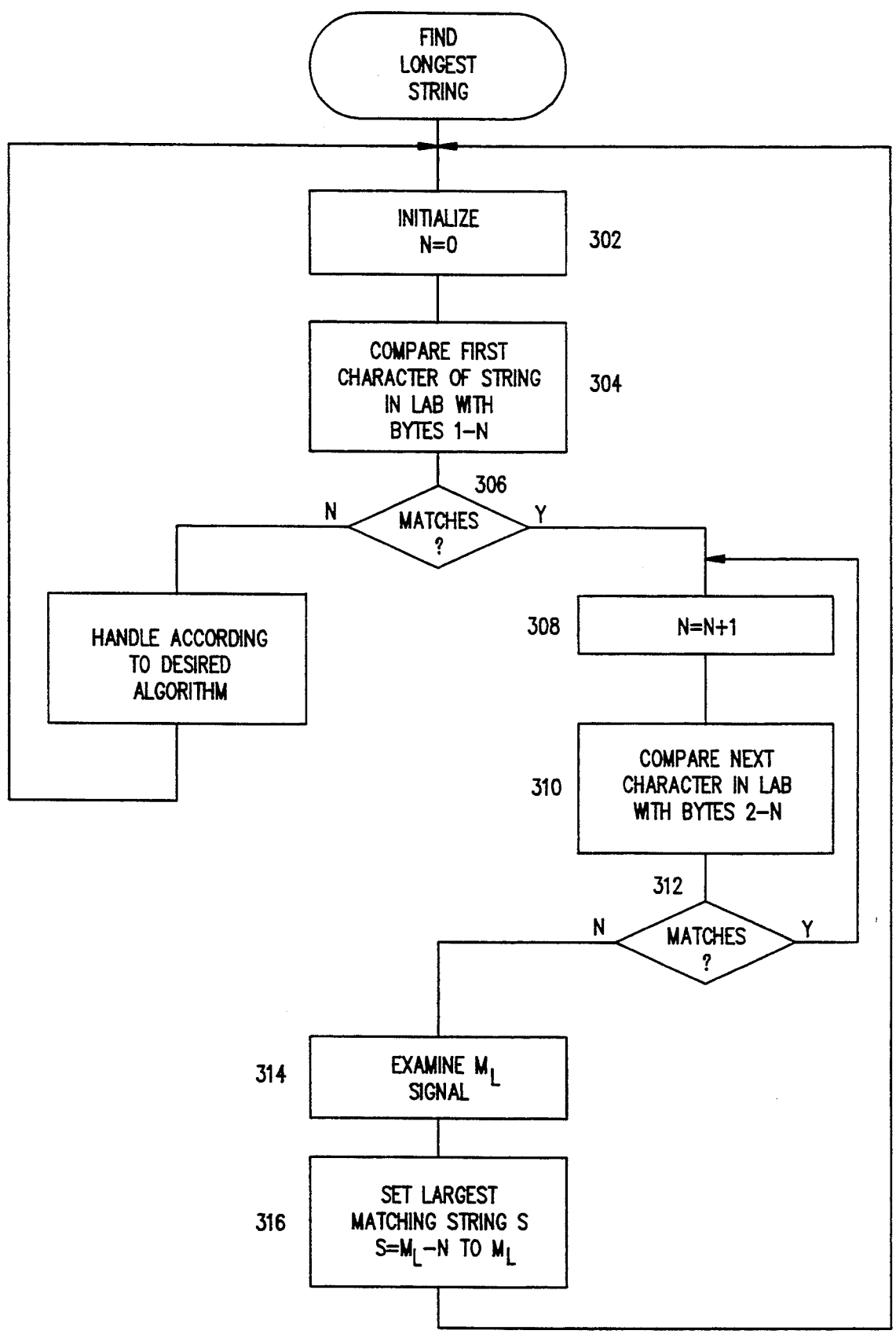
FIG. 3 is a flowchart diagram illustrating operation of the string search function of the content addressable memory of FIG. 2.

Referring now to FIG. 3, a flowchart diagram illustrating operation of a method for finding the longest string S in the CAM 200 which matches the string stored in the look-ahead buffer 230 is shown. The method of FIG. 3 implements step 104 of FIG. 1. It is noted that numerous different data compression methods and/or string comparison methods can be performed using the CAM 200 of FIG. 2, and the method shown in FIG. 3 is for illustrative purposes only.

In step 302 the method initializes a variable n to zero. In step 304 the method directs the CAM 200 to compare the first character in the look-ahead buffer 230 with each of the memory storage units or bytes of the CAM 200 in parallel. The method asserts the FIRST signal to guarantee that the comparisons of the first character performed in the CAM 200 do not depend on prior comparisons. In step 306 the method determines if there are any matches. It is noted that there could be more than one match between the first character in the look-ahead buffer 230 and the characters stored in bytes 1-N of the CAM 200. Thus, the method merely examines the output of the priority encoder 240 to determine if one or more matches occurred. In step 308 the method increments the variable n by 1. In step 310 the method compares the next character in the look-ahead buffer 230 with bytes 2-N of the CAM. Here it is noted that the MATCH signals $MATCH_1$- $MATCH_{N-1}$ asserted by the respective bytes in the CAM 200 guarantee that the second character in the look-ahead buffer 230 will only match respective bytes in the CAM 200 if the first character in the look-ahead buffer 230 matched the prior byte of the CAM 200. In other words, the second character of the string to be encoded will only match a byte in step 310 if the first character matched the prior byte in the CAM 200 in step 304.

In step 312 the method determines if any matches occurred. If so, the method returns to step 308, increments the variable n by 1, and performs the next comparison in step 310. This process continues until no more matches have occurred. If two or more equal length character strings in the CAM 200 match the string to be encoded, then the priority encoder 240 only outputs the match signal for the most recent character string match relative to the string being encoded. This is because, for example, a character string beginning in byte 10 of the CAM 200 will take less data to encode than an equal length character string occurring in byte 2000 of the CAM 200. However, if one character string match in the CAM 200 is longer than other possible matches, the corresponding match signal will be the only encoded value asserted by the priority encoder 240 when it is determined in step 312 that no more matches have occurred. The match signal $M_X$ output from the priority encoder 240 when no more matches have occurred in step 312 is referred to as $M_L$.

After there are no more matches in step 312, the method advances to step 314 and examines the match signal $M_L$ that is asserted by the priority encoder 240. As noted above, the signal $M_L$ represents one of the match signals $M_1$-$M_N$ that was last asserted when no matches occurred in step 312 and thus represents the last character of the longest character string S that matched the string in the look-ahead buffer 230. In step 316 the method determines the largest character string that matches the string being encoded to be the character string beginning at $M_{L-n}$ and ending at $M_L$. The method then returns to step 302.

If there were determined to be no matches of the first character in the look-ahead buffer 220 in step 306, then this occurrence can be handled in a number of different ways, depending on the desired algorithm. For example, one method would be to save the first character in a temporary buffer (not shown) and advance to the second character in the look-ahead buffer 230. When the second character is examined, the method again asserts the FIRST signal so that the second character in the look-ahead buffer is akin to the beginning of a new string search. Other methods may be used to handle this occurrence as desired.

Referring again to FIG. 1, when the longest string S is found, the method in FIG. 1 then encodes the string in the look-ahead buffer 230 accordingly in step 106 and slides the window j+1 characters, i.e. shifts the contents of the history buffer right j+1 characters, in step 108. The method then returns to step 104 to encode the new string in the look-ahead buffer 230, as described above.

Therefore, each of the bytes comprising the CAM 200 includes a respective AND gate which determines whether a match occurred for that respective byte which provides this output to a respective flip-flop, which is used to hold the results of a comparison. This result is then used by subsequent bytes of the CAM to perform string searches. Every byte in the CAM 200 except for byte 1 receives a MATCH signal from the previous byte of the CAM 200 which is used to inform the respective byte of the CAM 200 as to the results of a previous comparison in a prior byte. Thus, long sequences of bytes, i.e. strings, can be searched for with a byte wide CAM.

Therefore, a content addressable memory is provided which can perform string searches in hardware. This obviates the necessity of software having to implement string searches on top of the character search implemented in hardware. Performing this string search in hardware considerably increases the performance of the data compression engine and thus provides increased data compression performance.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A memory system which performs string searches in hardware, comprising:
   a plurality of memory storage units 1 to N, wherein each of said plurality of memory storage units is capable of storing associated data and is capable of comparing said associated data with external data and generating one or more compare signals indicative thereof;
   wherein at least one memory storage unit included within a subset of said memory storage units comprises: a comparator which receives said one or more compare signals associated therewith and a match signal from a prior memory storage unit which indicates whether a match occurred in said prior memory storage unit, wherein said comparator asserts a respective match signal if said one or more compare signals associated therewith indicate that said associated data of said at least one memory storage unit matches said external data and said prior memory storage unit match signal is asserted;

wherein said comparator provides said respective match signal to a subsequent memory storage unit.

2. The memory system of claim 1, wherein said at least one memory storage unit of said subset of said memory storage units further comprises:

a storage element which receives and stores said respective match signal from said comparator and provides said respective match signal to said subsequent memory storage unit.

3. The memory system of claim 1, wherein said subset includes several memory storage units, wherein said several memory storage units comprised in said subset each further includes an input receiving a first signal indicating a first type of comparison;

wherein each of said comparators comprised in said subset of said memory storage units does not consider said prior memory storage unit match signal in asserting said respective match signal if said first signal is asserted; and wherein each of said comparators comprised in said subset of said memory storage units considers said prior memory storage unit match signal if said first signal is not asserted and does not assert said respective match signal if said first signal is not asserted and said prior memory storage unit match signal is not asserted.

4. The memory system of claim 3, wherein said several memory storage units comprised in said subset each includes logic which receives said prior memory storage unit match signal and said first signal and provides an output match signal to said comparator, wherein said output match signal is asserted if either said prior memory storage unit match signal or said first signal is asserted.

5. The memory system of claim 3, wherein said first type of comparison comprises comparing the first character of a character string being searched.

6. The memory system of claim 1, further comprising:
an encoder which receives said respective match signals from each of said at least one memory storage unit comprised in said subset;

wherein said encoder outputs an encoded value representing which of said respective match signals are asserted.

7. The memory system of claim 6,
wherein said encoder comprises a priority encoder which outputs an encoded value representing one of said respective match signals which is asserted.

8. The memory system of claim 1, wherein said subset comprises memory storage units 2 to N of said memory system.

9. The memory system of claim 1, wherein said memory storage units are comprised of content addressable memory.

10. The memory system of claim 1, wherein said comparator comprises an AND gate.

11. A memory system which can perform string searches in hardware, comprising:
a plurality of memory storage units 1 to N for storing data, wherein each said memory storage unit is capable of storing associated data and is capable of comparing said associated data with external data and generating one or more compare signals indicative thereof;

wherein said memory storage unit 1 includes a comparator which receives said one or more compare signals associated therewith and asserts a respective match signal if said one or more compare signals associated therewith indicate that said associated data of said memory storage unit matches said external data; and wherein said memory storage units 2 to N each includes a comparator which receives said one or more compare signals associated therewith and a match signal from a prior memory storage unit which indicates whether a match occurred in said prior memory storage unit, wherein said comparator asserts a respective match signal if said one or more compare signals associated therewith indicate that said associated data of said memory storage unit 2 to N matches said external data and said prior memory storage unit match signal is asserted.

12. The memory system of claim 11, wherein each of said memory storage units 1 to n further comprises:
a storage element which receives and stores said respective match signal from said comparator and provides said respective match signal as an output;

wherein said storage element comprised in memory storage units 1 to N-1 each output said respective match signal to a subsequent memory storage unit.

13. The memory system of claim 11, wherein said memory storage units 2 to N each further include an input receiving a first signal indicating a first type of comparison;

wherein each of said comparators in said memory storage units 2 to N does not consider said prior memory storage unit match signal in asserting said respective match signal if said first signal is asserted; and wherein each of said comparators in said memory storage units 2 to N considers said prior memory storage unit match signal if said first signal is not asserted and does not assert said respective match signal if said first signal is not asserted and said prior memory storage unit match signal is not asserted.

14. The memory system of claim 13, wherein said memory storage units 2 to N each includes logic which receives said prior memory storage unit match signal and said first signal and provides an output match signal to said comparator, wherein said output match signal is asserted if either said prior memory storage unit match signal or said first signal is asserted.

15. The memory system of claim 13, wherein said first type of comparison comprises comparing the first character of a character string being searched.

16. The memory system of claim 11, further comprising:
an encoder which receives said respective match signals from each of said memory storage units 1 to N;

wherein said encoder outputs an encoded value representing which of said respective match signals are asserted.

17. The memory system of claim 16, wherein said encoder comprises a priority encoder which outputs an encoded value representing one of said respective match signals which is asserted.

18. The memory system of claim 11, wherein each of said memory storage units are comprised of content addressable memory.

19. The memory system of claim 11, wherein said comparator comprises an AND gate.

20. A method for performing a string search in a system comprising a buffer for storing a character string to be searched and a memory storeage system which performs string searches in hardware, wherein the memory storage system comprises a plurality of memory storage units 1 to n for storing data, wherein each said memory storage unit 1 to N is capable of comparing associated contents with external data and generating one or more compare signals indicative thereof, and wherein each said memory storage units 2 to N each includes a comparator which receives said one or more compare signals in addition to a match signal from a prior memory storage unit which indicates whether a match occurred in said prior memory storage unit, wherein said comparator asserts a respective match signal if said one or more compare signals indicate that said associated contents of said each memory storage unit 2 to N matches said external data and said prior memory storage unit match signal is asserted;

the method comprising:

comparing the first character of the character string in the buffer with the contents of each of the memory storage units 1 to N in the memory storage system, wherein said memory storage units 1 to N assert said respective match signals without considering said prior memory storage unit match signals;

comparing a subsequent character of the character string in the buffer with the contents of each of the memory storage units 2 to N in the memory storage system after said step of first character comparing, wherein said subsequent character only matches the contents of a respective memory storage unit if said prior memory storage unit match signal is asserted;

returning to said step of subsequent character comparing if a match occurred in said step of subsequent character comparing;

examining the respective match signals last asserted by each of said memory storage units 1 to N if a match did not occur in said step of subsequent character comparing; and finding the longest string in the memory storage system which matches the character string int he buffer using said last asserted match signals.

21. The method of claim 20, further comprising: determining if any matches occurred between the first character of the character string in the buffer and the associated contents of each of the memory storage units 1 to N in the memory storage system;

wherein said step of subsequent character comparing is performed only if a match was determined to have occurred in said step of determining.

22. The method of claim 20, wherein the memory storage system further comprises an encoder which receives said respective match signals from each of said memory storage units 1 to N and outputs a value representing one of said respective match signals that is asserted; wherein said step of examining comprises examining the value last asserted by said encoder.

23. The method of claim 20, further comprising:

incrementing a variable n after each of said steps of first character comparing and subsequent character comparing;

wherein said step of finding uses said incremented variable n in finding said longest string.

24. A method for performing data compression in a system comprising a look-ahead buffer for storing a character string to be searched and a history buffer which performs string searches in hardware, wherein the history buffer comprises a plurality of memory storage units 1 to N for storing data, wherein each said memory storage unit 1 to N is capable of comparing associated contents with external data and generating one or more compare signals indicative thereof, and wherein each said memory storage units 2 to N includes a comparator which receives said one or more compare signals in addition to a match signal from a prior memory storage unit which indicates whether a match occurred in said prior memory storage unit, wherein said comparator asserts a respective match signal if said one or more compare signals indicate that said associated contents of said each memory storage unit 2 to N matches said external data and said prior memory storage unit match signal is asserted;

the method comprising:

comparing the first character of the character string in the look-ahead buffer with the contents of each of the memory storage units 1 to N in the history buffer, wherein said memory storage units 1 to N assert said respective match signals without considering said prior memory storage unit match signals;

comparing a subsequent character of the character string in the look-ahead buffer with the contents of each of the memory storage units 2 to N in the history buffer after said step of first character comparing, wherein said subsequent character only matches the contents of a respective memory storage unit if said prior memory storage unit match signal is asserted;

returning to said step of subsequent character comparing if a match occurred in said step of subsequent character comparing;

examining the respective match signals last asserted by each of said memory storage units 1 to N if a match did not occur in said step of subsequent character comparing; and finding the longest string in the history buffer which matches the character string in the look-ahead buffer using said last asserted match signals.

25. The method of claim 24, further comprising:

determining if any matches occurred between the first character of the character string in the look-ahead buffer and the associated contents of each of the memory storage units 1 to N in the history buffer;

wherein said step of subsequent character comparing is performed only if a match was determined to have occurred in said step of determining.

26. The method of claim 24, wherein the history buffer further comprises an encoder which receives said respective match signals from each of said memory storage units 1 to N and outputs a value representing one of said respective match signals that is asserted; wherein said step of examining comprises examining the value last asserted by said encoder.

27. The method of claim 24, further comprising: incrementing a variable n after each of said steps of first character comparing and subsequent character comparing; wherein said step of finding uses said incremented variable n in finding said longest string.

* * * * *